United States Patent [19]
Walker

[11] Patent Number: 5,818,362
[45] Date of Patent: Oct. 6, 1998

[54] 5B4T CODING SCHEME

[75] Inventor: Christopher P. H. Walker, Milton Keynes, United Kingdom

[73] Assignee: SGS-Thomson Microelectronics Limited, Almondsbury Bristol, United Kingdom

[21] Appl. No.: 616,521

[22] Filed: Mar. 19, 1996

[30]   Foreign Application Priority Data

Mar. 29, 1995 [GB] United Kingdom .................. 9506470

[51] Int. Cl.[6] ...................................................... H03M 5/16
[52] U.S. Cl. ................................................ 341/57; 341/58
[58] Field of Search .................... 341/57, 58, 94

[56]   References Cited

U.S. PATENT DOCUMENTS

| | | | |
|---|---|---|---|
| 3,611,141 | 10/1971 | Waters | 341/57 |
| 3,689,699 | 9/1972 | Brenig et al. | 179/15 BS |
| 4,003,041 | 1/1977 | van Duuren et al. | 340/347 |
| 4,910,750 | 3/1990 | Fisher | 341/57 |
| 5,119,402 | 6/1992 | Ginzburg et al. | 375/17 |
| 5,257,270 | 10/1993 | Hilden et al. | 371/37.1 |
| 5,271,016 | 12/1993 | Hilden et al. | 371/37.1 |

FOREIGN PATENT DOCUMENTS

A-2 569 918   3/1986   France .

OTHER PUBLICATIONS

Standard Search Report from the European Patent Office dated Jun. 15, 1995.
Philips Telecommunication Review, vol. 34, No. 2, Jun. 1976 Hilversum NL, pp. 72–86, Buchner "Ternary Line Codes".

*Primary Examiner*—Marc S. Hoff
*Attorney, Agent, or Firm*—Wolf, Greenfield & Sacks, P.C.; James H. Morris

[57]   ABSTRACT

A method of encoding a five bit symbol into a four trit code word is disclosed, comprising defining out of forty-eight combinations of four trit code words three groups, each group containing sixteen code words, each code word within a group having a Hamming distance of at least two from any other code word in the group, and each code word being associated with a particular combination of four bits selected from said five bit symbol. An analogous method of decoding is also disclosed. Apparatus for performing the encoding and decoding is disclosed.

24 Claims, 9 Drawing Sheets

$S_{n-2}$ $S_{n-1}$ $S_n$
0 0 0
0 0 1
0 1 0
0 1 1
1 0 0
1 0 1
1 1 0
1 1 1

5B4T CODING SCHEME

FIELD OF THE INVENTION

The present invention relates to a method and apparatus for encoding data for transmission. The present invention relates particularly but not exclusively to the transmission of messages made up of short packets (of a minimum length of four bits up to a few hundred bits) over long distances (e.g. greater than about ten or twenty meters).

The invention is particularly concerned with transmitting messages between computers connected by a transmission link with each computer having a processor and a link interface for receiving messages from the processor, encoding the messages and transmitting the encoded data. Each link interface is also arranged to receive encoded data, decode it and provide messages to the processor.

BACKGROUND TO THE INVENTION

One known format for the transmission of messages by the computer is a so-called data-strobe format (D-S format), where two connections are provided in a given direction— one for data signals and one for strobe signals. The D-S format encodes messages into tokens which contain either data or control information. This message format is described in our European Patent Application No. 91304711.4.

In transmission systems which use long messages or packets, cyclic redundancy codes (CRC's) are used as an inexpensive and comprehensive error check. However, in communication between computer systems packets can be very short (in D-S format a single byte or less), and the CRC is an expensive and inefficient overhead. It becomes important to detect errors rapidly on decoding of the received data stream if higher-level checks such as CRCs are not being performed for individual packets. For this reason, the D-S format uses tokens each of which include a parity bit and ensures detection of single bit errors at the receiver.

Where the computers are connected by a single optical fibre in a given direction, a different code is required which only uses a single data path in each direction. Such a coding scheme is described in our European Patent Application Publication No. 0629067. European Patent Application Publication No. 0629067 describes a so-called 3 of 6 code which encodes four bit data tokens into balanced six-bit symbols using simple binary modulation. This is an effective coding scheme for distances of the order of a few hundred meters when such a code is being transmitted on optical fibre. It has the added advantage of allowing immediate detection of single bit errors. This is in contrast to other coding schemes where a single bit error can be decoded into a multiple bit error.

Where computers are connected over long distances (e.g. of the order of 100 m) by copper cable, the high baud rate of the 3 of 6 code results in attenuation of the data being transmitted. The attenuation of the cable increases with frequency. It is therefore desirable to minimise the baud rate as far as possible if messages are to be transmitted over long distances on copper cable.

So-called twisted pair connections are known to be used for connecting computers, and standard cables are known which contain four twisted pairs. Each twisted pair provides two single wire data paths which are physically twisted to reduce interference by cross-coupling. Such cables are used for 10 Base T Ethernet and for the twisted Pair Token Ring. One way of halving the baud rate is to use two twisted pairs for transmission and two twisted pairs for reception. It is one object of the present invention to provide a coding scheme in which the baud rate can be reduced by encoding the data into three-level code words, i.e. ternary code words.

Three level codes are known, for example the MS43 code which transmits four data bits in a three trit code word (4B3T), with the resulting lower baud rate as compared with a binary code. However, it suffers from the disadvantage referred to above that a single bit error can be decoded into a multiple bit error.

SUMMARY OF THE INVENTION

According to one aspect of the present invention there is provided a method of encoding a five bit symbol into a four trit code word, comprising the steps of defining out of forty-eight combinations of four trit code words three groups, each group containing sixteen code words, each code word within a group having a Hamming distance of at least two from any other code word in that group and each code word being associated with a particular combination of four bits selected from said five bit symbol, selecting one of said groups, and selecting a code word from said selected group in accordance with four bits out of said five bit symbol.

Thus, in the invention the baud rate is reduced by encoding the data into three-level code words, i.e. ternary code words by using trits having respective levels of −1, 0, 1.

Preferably the group is selected using the running digital sum of successive symbols. The group can thus be selected to maintain the running digital sum of the code close to zero or within finite bounds so as to ensure a d.c. balanced code.

The method preferably comprises the additional steps of generating an additional bit in dependence on said fifth bit, and using said additional bit with said running digital sum to select said groups.

The method preferably provides for the rapid detection of single bit errors, said additional bit preferably being a parity bit.

Preferably when the running digital sum is less than plus two and greater than minus two, a first group contains code words having a disparity of plus one, a second group contains code words having a disparity of minus one and a third group contains code words having a disparity of zero.

Preferably there are six further groups arranged in three pairs, wherein each pair contains for each symbol a pair of code words having a matched or opposite disparity, wherein the first pair includes code words having a disparity of plus or minus one, the second pair includes code words having a disparity of plus or minus two or zero and the third group includes code words having a disparity of plus or minus three or zero.

According to a second aspect of the present invention there is provided data transmission circuitry comprising input circuitry for receiving a sequence of symbols having five binary bits, encoding circuitry for en coding each five bit symbol into a code word having four ternary trits and output circuitry for transmitting a sequence of four trit code words, wherein the encoding circuitry includes a group select circuit which selects one of three groups each containing sixteen code words defined out of forty-eight combinations of four trit code words, each code word within a group having a Hamming distance of at least two from any other code word in that group, each code word being associated with a particular combination of four bits selected from said five bit symbol, the encoding circuit being operable to generate said code word in dependence on four bits of said five bit symbol in accordance with the group selected for that symbol.

The data transmission circuitry preferably further comprises running digital sum calculation circuitry for calculating the running digital sum of successive code words wherein the group select circuit uses the running digital sum of successive code words to select one of the three groups. The running digital sum calculation circuitry can thus be used to select the group for encoding each symbol such that the running digital sum is maintained within finite bounds (preferably plus/minus two at code-word boundaries).

The group selector preferably includes bit generating circuitry for generating an additional bit in dependence on the fith bit of the five bit symbol, said additional bit being used with said fifth bit to select said groups.

The bit generating circuitry is preferably a parity bit generating circuitry for enabling the rapid detection of single bit errors.

In another aspect the invention provides a method for decoding code words having four ternary trits into symbols having five binary bits.

In a further aspect the invention provides data receiving circuitry for carrying out said method of decoding.

For a better understanding of the present invention, and to show how the same may be carried into effect, reference will now be made by way of example to the accompanying drawings, in which:

DESCRIPTION OF THE PREFERRED EMBODIMENT

Figure 1:
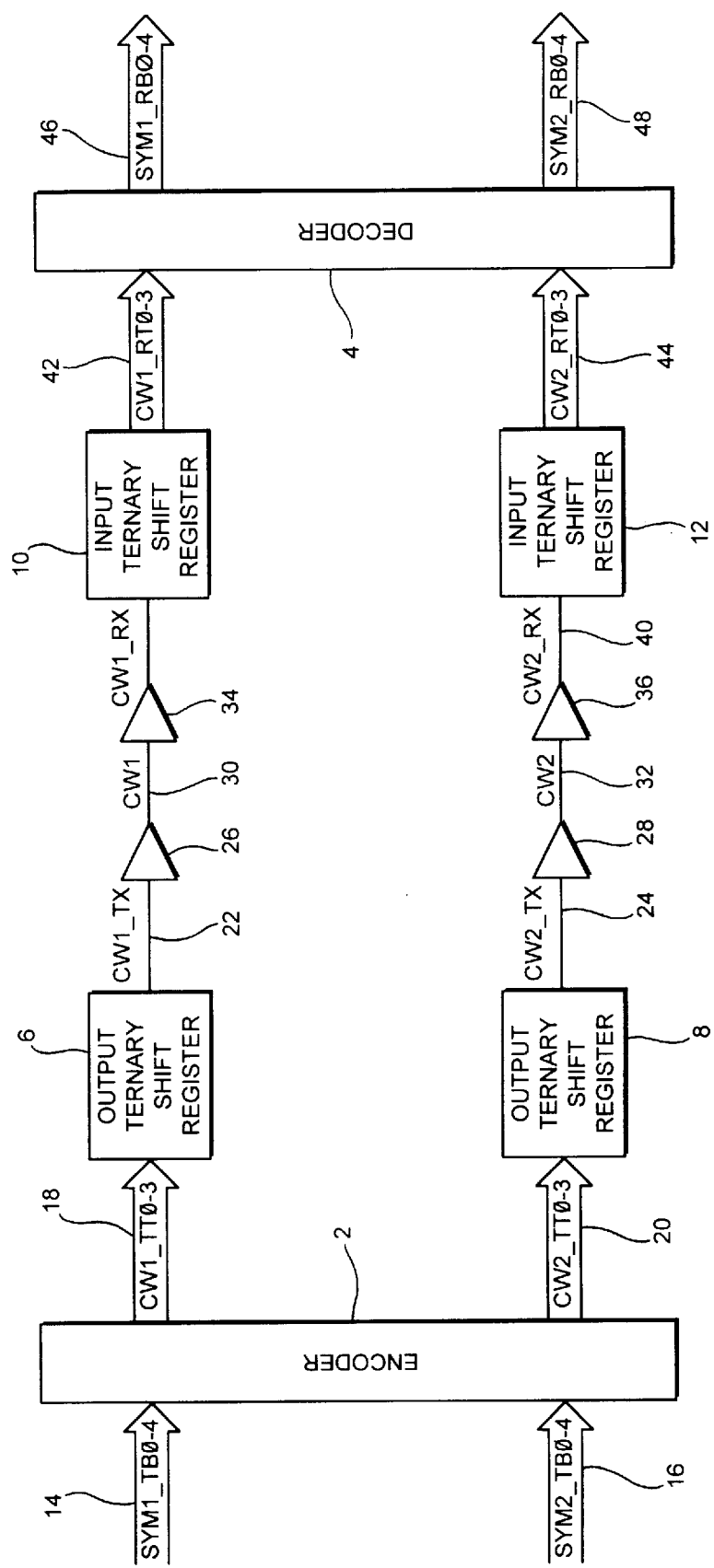
FIG. 1 is a block diagram of transmitting and receiving circuits for implementing the present invention.

The basic structure required to implement the invention will first be described with reference to FIG. 1. FIG. 1 illustrates a block diagram of basic circuitry for implementing the present invention to encode and decode data. The circuitry includes an encoder 2, a decoder 4, two output ternary shift registers 6 and 8, two line drivers 26 and 28, two input ternary shift registers 10 and 12, and two line receivers 34 and 36. The encoder 2 receives as inputs a first set 14 of five parallel binary bits SYM1_TB0–4 representing a first symbol to be encoded and a second set 16 of five parallel binary bits SYM2_TB0–4 representing a second symbol to be encoded. The symbols are provided by a processor connected to the encoder and represent a message or part of a message to be transmitted.

For the purposes of this description each trit can be considered as being transmitted on a single line and has three states −1, 0, +1 represented by a negative voltage, a zero voltage, and a positive voltage respectively.

In accordance with the present invention the encoder 2 outputs a first set 18 of four parallel ternary trits CW1_TT0–3 representing a first code-word and a second set 20 of four parallel ternary trits CW2_TT0–3 representing a second code-word. The output ternary shift register 6 receives the first set 18 of four parallel ternary trits CW1_TT0–3 and outputs them in serial format as signal CW1_TX on line 22. The output ternary shift register 8 receives the second set 20 of 4 parallel ternary trits CW2_TT0–3 and outputs them in serial format as signal CW2_TX on line 24. The line driver 26 receives the ternary signal CW1_TX on its input and outputs it onto a first twisted pair connection 30 as a signal CW1. The line driver 28 receives the ternary signal CW2_TX on its input and outputs it onto a second twisted pair connection 32 as a signal CW2. The line receiver 34 receives the signal CW1 on its input and outputs it as signal CW1_RX on line 38. The line receiver 36 receives the signal CW2 on its input and outputs it as signal CW2_RX on line 40. The input ternary shift register 10 receives the signal CW1_RX on its serial input and outputs a set 42 of four parallel trits CW1_RT0–3 representing the first received code-word. The input ternary shift register 12 receives the signal CW2_RX on its serial input and outputs a set 44 of four parallel trits CW2_RT0–3 representing the second received code-word. The decoder 4 receives as inputs the first set 42 and the second set 44 of four parallel trits. In accordance with the present invention the decoder 4 outputs a first set 46 of five parallel binary bits SYM1_RB0–4 representing the first received symbol and a second set 48 of five parallel binary bits SYM2_RB0–4 representing the second received symbol.

Although FIG. 1 illustrates an arrangement in which first and second sets of symbols are received in parallel and encoded onto respective parallel twisted pairs in one direction, the first and second sets of symbols may be encoded onto a single twisted pair connected in one direction. In such an arrangement code words corresponding to symbols of the first and second sets may be alternatively transmitted on the single twisted pair connection.

The encoding scheme described herein provides a nB(n-1)T trellis code which is fully dc balanced and which is amenable to Viterbi decoding, and for which there is always a Hamming distance of at least two between valid code-word sequences. Each code word in a group has a Hamming Distance of at least two from any other code word in that group. The preferred example described herein is a scheme in which n=5.

As just described, the encoder receives the symbol pairs and outputs the code-word pairs. Each code-word of a code-word pair represents a respective symbol of a symbol pair.

There are eighty-one possible combinations to be obtained from a 4 trit ternary code-word. The code-words − − − −, 0000 and + + + + are not used, however, because they do not have any transistions, and furthermore the code-words − − − − and + + + + increase the running digital sum (RDS) of the code. The RDS is the digital sum of −'s, 0's and +'s that have been transmitted since the start of transmission. To achieve d.c. balanced transmission, the RDS should be kept low. Analysing the remaining seventy-eight code-words gives the following details:

a) eighteen code-words have a code-word disparity of zero;

b) sixteen code-words have a code-word disparity of minus one, and the sixteen code-words complementary to those sixteen have a disparity of plus one;

c) ten code-words have a code-word disparity of minus two, and the ten code-words complementary to those ten have a disparity of plus two; and d) four code-words have a code-word disparity of minus three, and the four code-words complementary to those four have a disparity of plus three.

Now, if the eighteen code-words having zero disparity are considered to be paired with themselves and the code-words having a negative disparity are paired with their respective complementary code-words having a positive disparity, there are forty-eight code-word pairs having zero disparity. In any code it is desirable to keep the RDS as close to zero as possible so that the code is as closely d.c. balanced as possible. The coding scheme according to the preferred example has a RDS which does not exceed plus/minus two at code-word boundaries. As will be described hereinafter the selection of code-words is controlled to maintain the RDS within this limit.

The forty-eight code-words pairs having zero disparity can be conveniently considered as three sets of sixteen code-word pairs having zero disparity. That is, one set comprising the 16 set (b) pairs, one set comprising the ten set (c) pairs and six set (a) pairs and one set comprising the 4 set (d) pairs and 12 set (a) pairs. Four binary bits can be fully encoded with sixteen code-words. Thus each five bit binary symbol can be encoded by encoding four of the five bits according to one of the three sets of sixteen code-word pairs, with the fifth bit being used to determine whether the code-word of the pair with negative or positive disparity is used.

Given that there are three sets of sixteen code-word pairs having zero disparity it is desirable to be able to select one of the three sets rather than to have preselected only one set. As the binary symbols are being encoded in pairs, the respective fifth bits of each symbol can be used in combination to provide a one of four selection. Each set of sixteen code words can be called an alphabet, and the three alphabets can be called A, B and C.

It is desirable to have a parity bit associated with each code-word pair transmitted so that errors can be detected rapidly upon decode. By using the respective fifth bits of each symbol in a pair a parity bit can be generated, and this parity bit in combination with the respective fifth bits enables eight combinations of code-word sets, or alphabets, to be selected. The parity bit is represented in the transmitted code-words by the choice of alphabet used to encode the symbol and not as a particular code-word bit.

As has been mentioned hereinabove it is desirable that the RDS of the code be kept close to zero. In the described embodiment, the encoder calculates the RDS of the code and selects the code-word of a code-word pair with the negative or positive disparity according to whether the RDS is positive or negative so as to bring the RDS back towards zero or towards the opposite sign. Thus the code is dc balanced. Furthermore, more than one alphabet selection is provided to choose from, such that different alphabet selections have different code-word disparities. The preferred embodiment of the present invention utilises two alphabet selections: one to be used when the RDS is extreme i.e. RDS=$\pm$2 and one to be used when the RDS is non-extreme i.e. +2>RDS>−2. The alphabet selections according to a preferred embodiment of the present invention are shown in Table 1. An alternative embodiment may utilise two different alphabet selections, for example: one to be used when the RDS is non-zero and one to be used when the RDS is zero.

The left-hand portion of Table 1 illustrates the alphabet selections according to the preferred embodiment when the RDS is extreme. In this alphabet selection, alphabet A comprises the sixteen code-word pairs with disparity of plus/minus one; alphabet B comprises the ten code-word pairs with disparity of plus/minus two together with the six code-words with disparity zero consisting of two −'s and two +'s; and alphabet c comprises the four code-word pairs with disparity of plus/minus three together with the twelve code-words with disparity zero consisting of one − and one +.

When an alphabet selection is made, the choice of code-word is made to keep the RDS within specified boundaries. In the described example the specified boundary of the RDS is plus/minus two.

In extreme alphabet A, the disparity of all the code words is odd, and so there must be a Hamming distance of at least two between code-words in the alphabet. In extreme alphabet B, all the code-words are even disparity, and so similarly have a Hamming distance of at least two between code-words in the alphabet. In extreme alphabet C, some code-words have even disparity and some have odd disparity, but the difference between zero disparity and plus/minus three disparity code-words means a Hamming distance of at least three between the zero and odd disparity members of the alphabet.

The right-hand portion of Table 1 illustrates the alphabet selections according to the preferred embodiment when the RDS is non-extreme. When the RDS at a code-word boundary is non-extreme, it is undesirable to use code-words which have a disparity of plus/minus three because they would take the RDS beyond the range of plus/minus two. Hence the non-extreme alphabet is provided. In this alphabet selection, alphabet A comprises the sixteen code-words with disparity plus one; alphabet B comprises the sixteen code-words with disparity minus one; and alphabet C comprises sixteen of the code-words with disparity zero.

The allocation of code-words to alphabets for encoding symbols as shown in Table 1 is only one example of various alphabet allocations. The allocation has, however, been made to be as systematic as possible, and to minimise the Hamming distance between the code-words for the same symbol in different alphabets.

Referring again to FIG. 1, under the control of a transmission clock (which is not shown in FIG. 1 for reasons of clarity) the two binary symbols to be encoded represented as signals SYM1_TB0–4 and SYM2_TB0–4 are inputted to the encoder 2 in parallel form. In a manner which will be described in full detail hereinbelow, the encoder 2 encodes the two symbols and outputs two parallel ternary code-words to be transmitted, CW1_TT0–3 and CW2_TT0–3. The two parallel code-words to be transmitted are parallel loaded into respective output ternary shift registers 6 and 8. The code-words are then outputted from the ternary shift registers in serial form, to respective line drivers 26 and 28, which convert the trits on the lines 22 and 24 to an appropriate three level signal for transmission on the twisted pairs 30 and 32. The line receivers 34 and 36 detect the three level signals on the twisted pairs and convert them into appropriate signal levels to serially store the received trits in the input ternary shift registers 10 and 12. The respective received code-words are then outputted in parallel from the ternary shift register to the decoder 4. The received code-words represented by signals CW1_RT0–3 and CW2_RT0–3 are then decoded, as will be described in detail hereinbelow, into two received symbols represented by signals SYM1_RB0–4 and SYM2_RB0–4 respectively.

Figure 2:
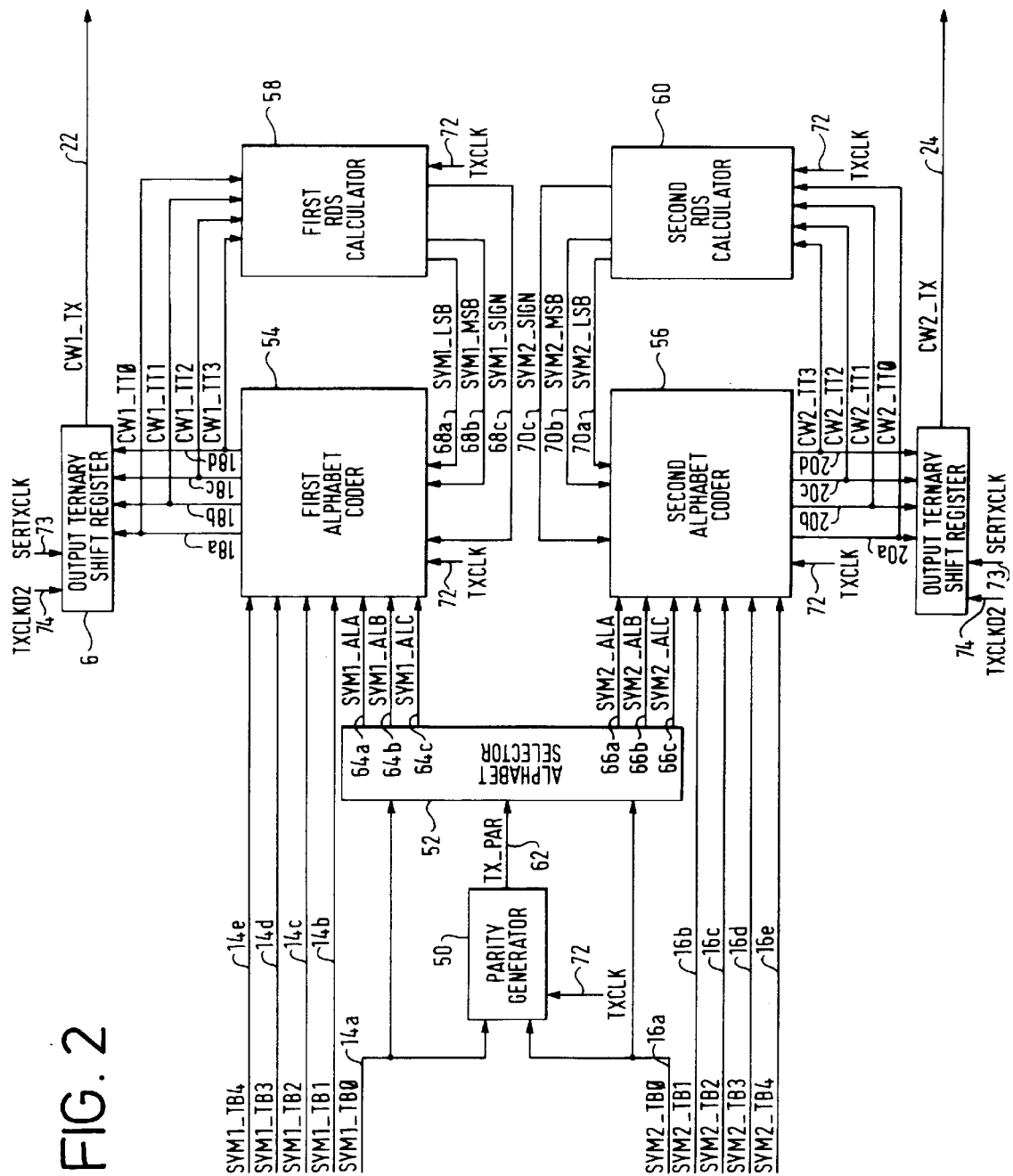
FIG. 2 is a block diagram of an encoder such as may be used in the transmitting circuit of FIG. 1.

FIG. 2 is a block diagram of circuitry which may be used to implement the encoder 2 of FIG. 1. FIG. 2 also includes the output ternary shift registers 6 and 8 of FIG. 1. The encoder 2 comprises a parity generator 50, an alphabet selector 52, a first alphabet coder 54, a second alphabet coder 56, a first RDS calculator 58, and a second RDS calculator 60. The parity generator 50 receives as inputs bit SYM1_TB0 on line 14a of the first set 14 of five parallel binary bits and bit SYM2_TB0 on line 16a of the second set 16 of five parallel binary bits, and generates an output signal TX_PAR on line 62. The alphabet selector 52 receives as inputs bit SYM1_TB0, bit SYM2_TB0 and the signal TX_PAR, and generates output signals SYM1_ALA, SYM1_ALB and SYM1_ALC on lines 64a, 64b and 64c respectively, and output signals SYM2_ALA, SYM2_ALB and SYM2_ALC on lines 66a, 66b and 66c respectively. The first alphabet coder 54 receives as inputs the bits SYM1_TB1–4 on lines 14b–14e of the first set 14 of five parallel binary bits, the signals SYM1_ALA, SYM1_ALB and SYM1_ALC, a signal SYM1_LSB on line 68a, a signal SYM1_MSB on line 68b, and a signal SYM1_SIGN on line 68c. The first alphabet coder 54 generates as outputs the signals CW1_TT0–3 on lines 18a to 18d of the first set 18 of four parallel ternary bits. The second alphabet coder 56 receives as inputs the bits SYM2_TB0–4 on lines 16b–16e of the second set 16 of five parallel binary bits, the signals SYM2_ALA, SYM2_ALB and SYM2_ALC, a signal SYM2_LSB on line 70a, a signal SYM2_MSB on line 70b, and a signal SYM2_SIGN on line 70c. The second alphabet coder 56 generates as outputs the signals CW1_TT0–3 on lines 20a to 20d of the second set 20 of four parallel ternary trits. The first RDS calculator 58 receives as inputs the signals CW1_TT0–3 and generates as outputs the signals SYM1_LSB, SYM1_MSB, and SYM1_SIGN. The second RDS calculator 60 receives as inputs the signals CW2_TT0–3 and generates as outputs the signals SYM2_LSB, SYM2_MSB, and SYM2_SIGN. The parity generator 50, first alphabet coder 54, second alphabet coder 56, first RDS calculator 58, and second RDS calculator 60 each receive a transmit clock signal TXCLK on line 72. The output ternary shift registers 6 and 8 receive a clock signal TXCLKD2 on line 74 and a clock signal SERTXCLK on line 73.

The operation of the encoder 2 of FIG. 2 will now be described with reference to FIGS. 3 to 6.

Figure 3:
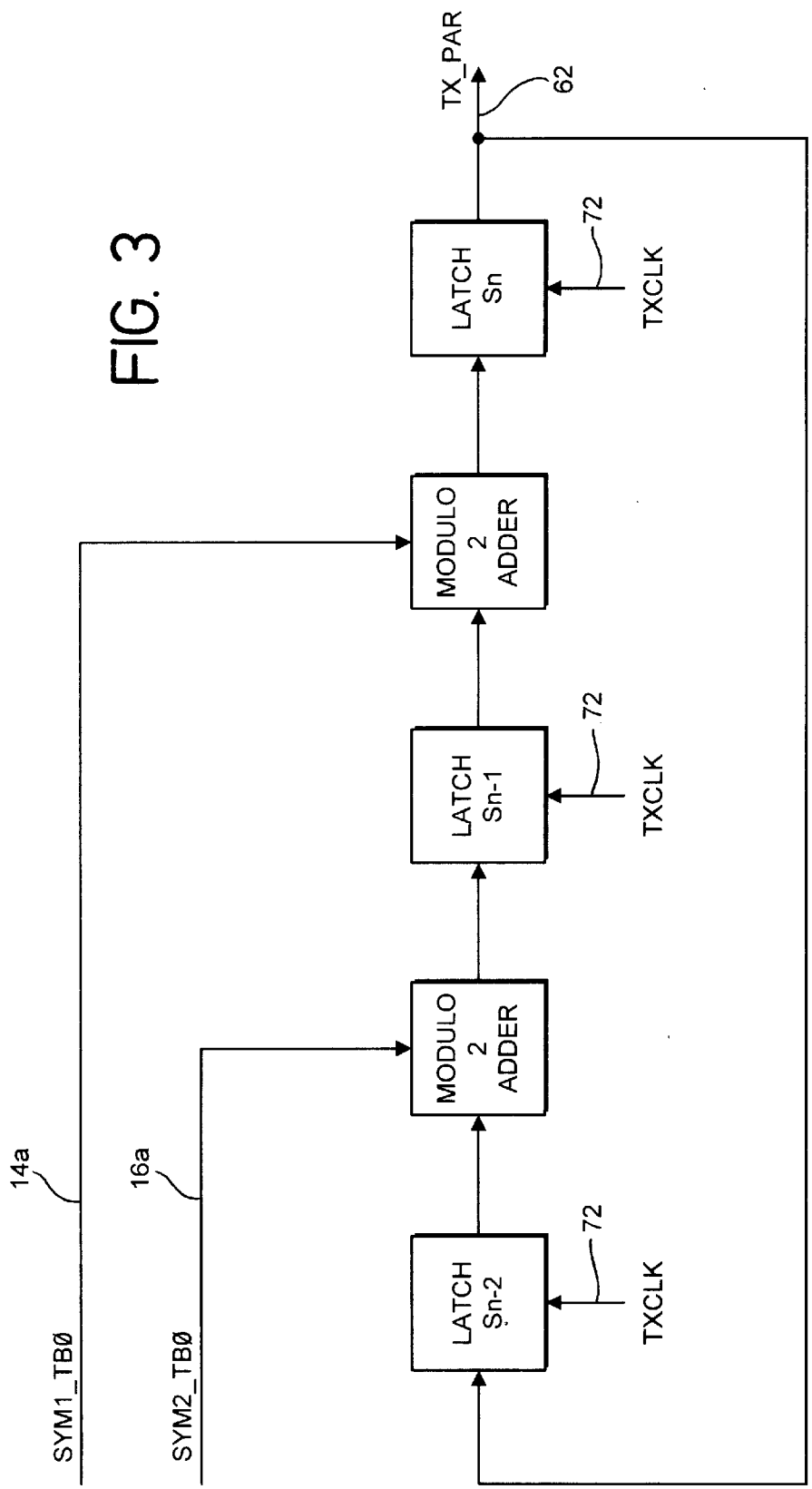
FIG. 3 illustrates an implementation of a parity generator according to a preferred embodiment of the present invention.

FIG. 3 illustrates the implementation of the parity generator 50 according to a preferred embodiment of the present invention. The parity generator 50 comprises a latch Sn-2 80, a latch Sn-1 82, a latch Sn 84, and two modulo-2 adders 86 and 88. The modulo-2 adders 86 and 88 each have two inputs and an output.

Modulo-2 adder 86 receives as one input the output of latch Sn-2 80, and as the other input the bit SYM2_TB0 on line 16a. The output of modulo-2 adder 86, which is the modulo-2 sum of its inputs, forms the input to latch Sn-1 82. Modulo-2 adder 88 receives as one input the output of latch 82, and as the other input the bit SYM1_TB0 on line 14a. The output of modulo-2 adder 88, which is the sum of its inputs, forms the input to latch Sn 84. The output of latch Sn 84 forms the signal TX_PAR on line 62 and the input to the latch Sn-2 80. The latches are all latched by the clock signal TXCLK on line 72.

Figure 4:
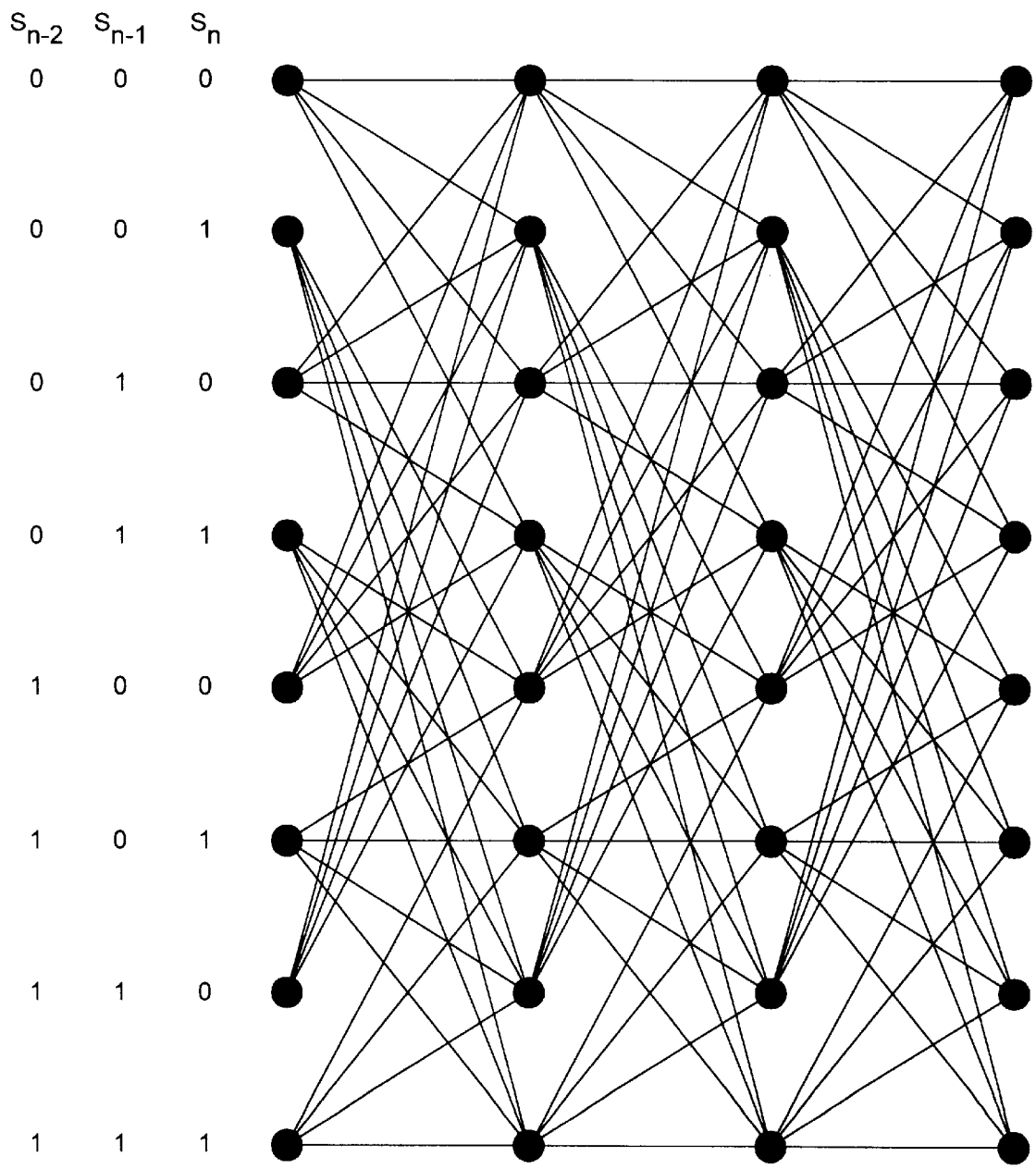
FIG. 4 is a trellis diagram showing the state transitions of the parity generator of FIG. 3.

The parity generator 50 is a convolutional coder which generates the parity bit TX_PAR in dependence on past and present values of the bits SYM2_TB0, SYM1_TB0, and TX-PAR. The parity bit TX-PAR is updated on every cycle of the clock TXCLK. It will be understood that on every cycle of the clock TXCLK the first and second sets 14,16 of five parallel binary bits on the inputs to the encoder 2 will be updated. Thus the parity bit TX_PAR is updated for each new pair of symbols to be encoded. The table of state transitions for the convolutional coder is shown in Table II, and the corresponding trellis diagram is shown in FIG. 4. The trellis diagram is an alternative representation of the state transitions of Table II.

The convolutional code used in the preferred embodiment is a systematic code, wherein the bits SYM1_TB0 and SYM2_TB0 of the symbols to be encoded are used directly, and the parity bit TX_PAR is a parity function of the present value of these two bits and previous values. Such a convolutional code is disclosed in IEEE Communications Magazine, February 1987, Vol. 25, No. 2, page 14, FIG. 3a. This permits a simple check for single bit errors in decoding as will be discussed hereinbelow in the detailed description of the decoder 4.

Hence, when a new pair of symbols is presented to the inputs of the encoder 2, an updated value of the parity bit TX_PAR is generated after an edge of the transmit clock signal TXCLK.

The alphabet selector 52 of FIG. 2 is, in the preferred embodiment, a logic block which generates its outputs in dependence on the current state of its inputs. The alphabet decoder selects the coding alphabet for the first and second pairs in dependence on the values of the signals SYM1_TB0, SYM2_TB0 and TX_PAR. The selection of the alphabets is illustrated by Table III, which is given only as an example. From the detail of Table III it will be apparent that this allocation of alphabets can be simply achieved using combinational logic. Hence after a new pair of symbols is presented to the input of the encoder 2, the outputs of the alphabet selector 52 are updated in response to the new signal TX_PAR on an edge of the clock signal. Hence the signals SYM1_ALA, SYM1_ALB and SYM1_ALC are set according to which alphabet the first symbol is to be encoded, and the signals SYM2_ALA, SYM2_ALB and SYM2_ALC are set according to which alphabet the second symbol is to be encoded.

The alphabet allocations in Table III for given values of SYM1_TB0, SYM2_TB0 and TX_PAR are only an example of a multitude of allocations which could be chosen.

Figure 5:
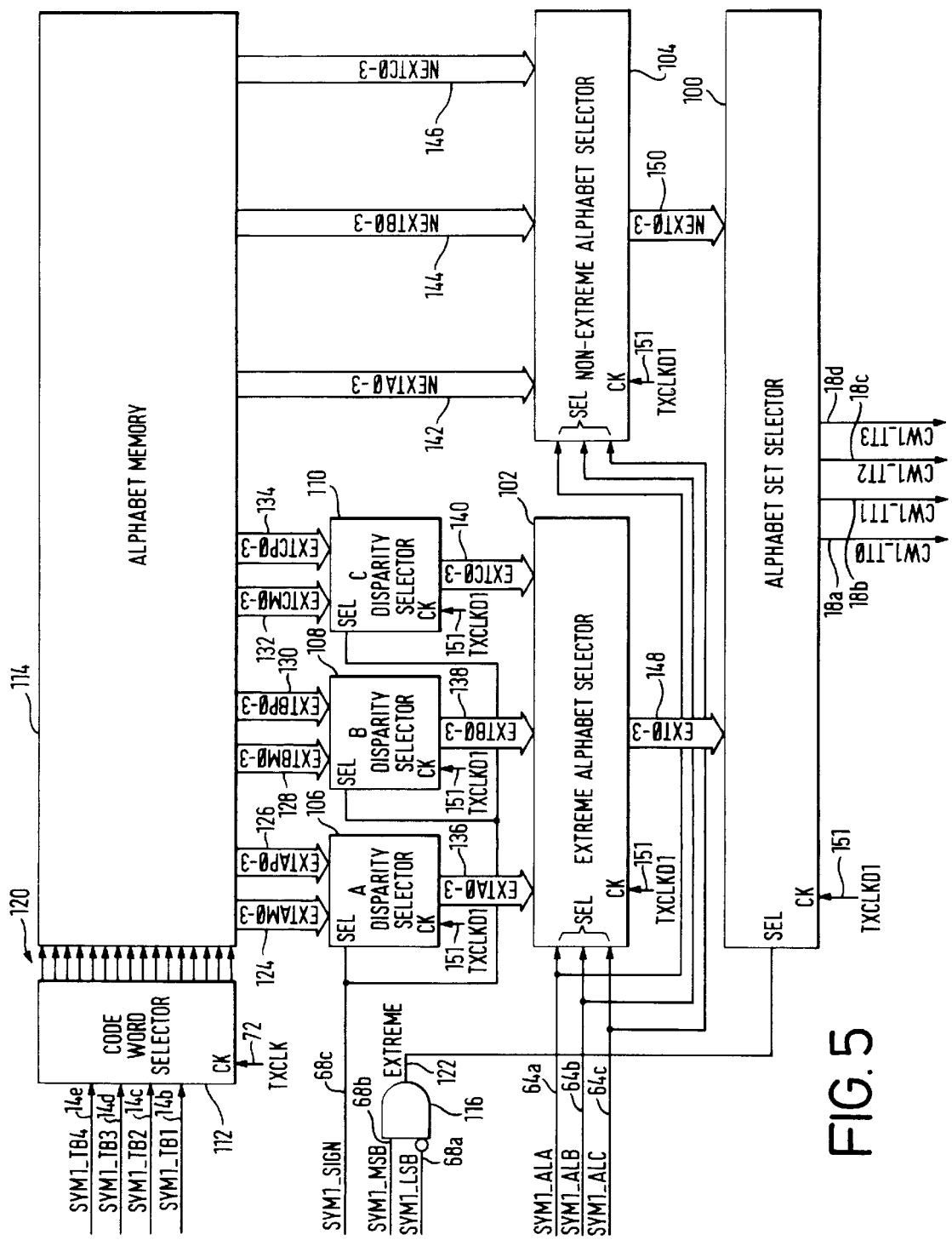
FIG. 5 illustrates an implementation of an alphabet encoder according to a preferred embodiment of the present invention.

FIG. 5 illustrates an implementation of the first alphabet coder 54 according to a preferred embodiment of the present invention. The first alphabet coder 54 comprises an alphabet set selector 100, an extreme alphabet selector 102, a non-extreme alphabet selector 104, an A disparity selector 106, a B disparity selector 108, a C disparity selector 110, a code-word selector 112, an alphabet memory 114, and an AND gate 116. The code-word selector 112 receives as inputs the signals SYM1_TB1–4 on lines 14b–14e and the clock signal TXCLK on line 72. The code-word selector 112 outputs sixteen signals on lines 120 which form inputs to the alphabet memory 114. The AND gate 116 receives the signal SYM1_LSB on line 68a at an inverting input and the signal SYM1_MSB on line 68b at a non-inverting input and generates a signal EXTREME at its output on line 122. The A disparity selector 106, B disparity selector 108, and C disparity selector 110 each receive at respective select inputs the signal SYM1_SIGN on line 68*c,* and at respective clock inputs a clock signal TXCLKD1 on line 151. The A disparity selector 106 also receives as inputs four trits EXTAM0–3 on lines 124 from the alphabet memory 114 and four trits EXTAP0–3 on lines 126 from the alphabet memory 114 and generates output signals EXTA0–3 on lines 136. The B disparity selector 108 also receives as inputs four trits EXTBM0–3 on lines 128 from the alphabet memory 114 and four trits EXTBP0–3 on lines 130 from the alphabet memory 114, and generates output signals EXTB0–3 on lines 138. The extreme alphabet C disparity selector 110 also receives as inputs four trits EXTCM0–3 on lines 130 from the alphabet memory and four trits EXTCP0–3 on lines 132 from the alphabet memory, and generates ouput signals EXTC0–3 on lines 140. The extreme alphabet selector 102 and the non-extreme alphabet selector 104 receive at respective select inputs the signals SYM1_ALA, SYM1_ALB and SYM1_ALC on lines 64*a,* 64*b* and 64*c* respectively, and at respective clock inputs the clock signal TXCLKD1. The extreme alphabet selector 102 additionally receives the signals EXTA0–3, EXTB0–3 and EXTC0–3 as inputs, and generates four output signals EXT0–3 on lines 148. The non-extreme alphabet selector 104 additionally receives signals NEXTA0–3 on lines 142 from the alphabet memory 114 signals NEXTB0–3 on lines 144 from the alphabet memory 114, and signals NEXTC0–3 on lines 146 from the alphabet memory 114, and generates output signals NEXT0–3 on lines 150. The alphabet set selector 100 receives the signal EXTREME at a select input, the signals EXT0–3 and the signals NEXT0–3, and the clock signal TXCLKD1 at a clock input, and generates the signals CW1_TT0–3 on output lines 18*a*–18*d.*

The alphabet memory 114 is effectively a look-up table and will contain the contents of Table I as described hereinabove. In response to the four bits SYM1_TB1–4 of one symbol to be encoded on its inputs, the code-word selector 112 will activate one of its sixteen output lines 120 and thereby select a row of Table I from which the code-word is to be selected. The outputs 120 of the code-word selector 112 will be updated on each cycle of the clock signal TXCLK for every new symbol to be encoded. It will be understood that one and only one of the sixteen lines 120 can be activated at a time.

The signals SYM1_LSB and SYM1_MSB represent the RDS of the code-words transmitted from the first alphabet coder up to the code-word boundary of the last code-word transmitted, i.e. the last code-word outputted from the first alphabet coder 54. The calculation of the running RDS will be described in detail hereinbelow with reference to FIG. 6. It is a property of the described preferred embodiment of the present code that the magnitude of the RDS at code-word boundaries should not exceed two. The first pair alphabet coder 54 may contain circuitry which flags an error and interrupts transmission should the magnitude of the RDS exceed two. Such circuitry is not shown in FIG. 5 but the implementation of such will be within the scope of one skilled in the art.

The AND gate 116 is used to determine whether the extreme alphabet sets or the non-extreme alphabet sets of the Table I are selected. If the magnitude of the RDS is zero (SYM1_LSB=SYM1_MSB=0) or one (SYM1_LSB=1, SYM1_MSB=0) then the signal EXTREME will be zero. If the magnitude of the RDS is two (SYM1_LSB=0, SYM1_MSB=1) then the signal EXTREME will be high.

The signal SYM1_SIGN indicates whether the RDS is negative or positive. If the RDS is negative then each of the A disparity selector 106, B disparity selector 108, and C disparity selector 110 select a code-word with positive disparity. If the RDS is positive then each of the A disparity selector 106, B disparity selector 108, and C disparity selector 110 select a code-word with negative disparity.

Referring to FIG. 5 and Table I, the A disparity selector 106 connects either the signals EXTAM0–3 or EXTAP0–3 to form the signals EXTA0–3 in dependence on the signal SYM1_SIGN. The signals EXTAM0–3 represent the trit positions of the code-words in extreme alphabet A having disparity minus one, and the signals EXTAP0–3 represent the trit positions of the code-words in extreme alphabet A having disparity plus one. The B disparity selector 108 connects either the signals EXTBM0–3 or EXTBP0–3 to form the signals EXTB0–3 in dependence on the signal SYM1_SIGN. The signals EXTBM0–3 represent the trit positions of the code-words in extreme alphabet B having disparity minus two (or zero), and the signals EXTBP0–3 represent the trit positions of the code-words in extreme alphabet B having disparity plus two (or zero). The C disparity selector 110 connects either the signals EXTCM0–3 or EXTCP0–3 to form the signals EXTC0–3 in dependence on the signal SYM1-SIGN. The signals EXTCM0–3 represent the trit positions of the code-words in extreme alphabet C having disparity minus three (or zero), and the signals EXTCP0–3 represent the trit positions of the code-words in extreme alphabet C having disparity plus three (or zero).

The signals SYM1_ALA, SYM1_ALB and SYM1_ALC determine which alphabet the code-word will be taken from and are determined by the alphabet selector 52 as described hereinabove. The extreme alphabet selector 102 is utilised such that one of the three sets of signals EXTA0–3, EXTB0–3 or EXTC0–3 will form the signals EXT0–3 in dependence on the alphabet selected by the signals SYM1_ALA, SYM1_ALB and SYM1_ALC.

When the RDS is non-extreme, the non-extreme alphabet selector 104 is utilised such that one of the three sets of signals NEXTA0–3, NEXTB0–3 or NEXTC0–3 will be connected to form the output signals NEXT0–3 in dependence on the alphabet selection signals SYM1_ALA, SYM1_ALB and SYM1_ALC. Referring to Table I, the signals NEXTA0–3 represent the trit positions of the code-words in non-extreme alphabet A, the signals NEXTB0–3 represent the trit positions in non-extreme alphabet B, and the signals NEXTC0–3 represent the trit positions in non-extreme alphabet C.

The alphabet set selector 100 is controlled by the signal EXTREME to connect either the signals EXT0–3 or NEXT0–3 to form the output signals CW1_TT0–3. Hence the alphabet set selector 100 determines whether the alphabet on the left-hand side or right-hand side of Table I is used according to whether the RDS is extreme or non-extreme.

The inputs to the code-word selector 112 are latched by the clock signal TXCLK, and the A disparity selector 106, the B disparity selector 108, the C disparity selector 110, the extreme alphabet selector 102, the non-extreme alphabet selector 104 and the alphabet set selector 100 all have their enable and select inputs latched by the clock signal TXCLKD1, such that these control inputs are updated for every new symbol to be encoded on every cycle of the clock signals TXCLK and TXCLKD1. The code-word selector 112 is clocked by the same clock signal TXCLK which clocks the parity generator 50. However, the clock signal which clocks the other elements of the first alphabet coder as shown in FIG. 5 must be delayed from the clock signal TXCLK so that the signals SYM1_ALA, SYM1_ALB, and SYM1_ALC have time to settle to their new values in response to the new symbol to be encoded. Hence the clock signal TXCLKD1 is merely the clock signal TXCLK slightly delayed.

Furthermore, referring back to FIG. 2 it is important that the clock signal TXCLKD2 on line 74 which loads the ternary output shift register 6 in parallel is delayed relative to the clock signal TXCLKD1 so that the signals CW2_TT0–3 are allowed to settle before being shifted into the output ternary shift register. The trits are clocked out of the output shift register serially by the clock SERTXCLK which has a frequency of four times the clock signal TXCLK and is delayed relative to the clock signal TXCLKD2.

Hence, on an edge of the clock signal TXCLK in response to a new pair of symbols being presented at the input to the encoder 2, four bits SYM1_TB1–4 of the first symbol of the pair are latched into the code-word selector 112, and a row of the alphabet memory 114 is selected by one of the lines 120. An edge of the clock signal TXCLKD1 then latches the other circuitry of the first alphabet coder 54 such that the new code-word to be transmitted in response to the new symbol is output as signal CW1_TT0–3 to the output ternary shift register 6. An edge of the clock signal TXCLKD2 then loads the ternary shift register in parallel, and the code-word to be serially transmitted is then shifted out under control of the clock signal TXCLKD2.

The operation of the second alphabet coder 56 and the output ternary shift register 8 are identical to the operation of the first alphabet coder 54 and the output ternary shift register 6, with the signals appropriately changed. The first and second alphabet coders operate in parallel such that in response to a cycle of the transmit clock signal TXCLK, a pair of code-words CW1_TT0–3 and CW2_TT0–3 are generated from a pair of symbols SYM1_TB0–4 and SYM2_TB0–4.

Figure 6:
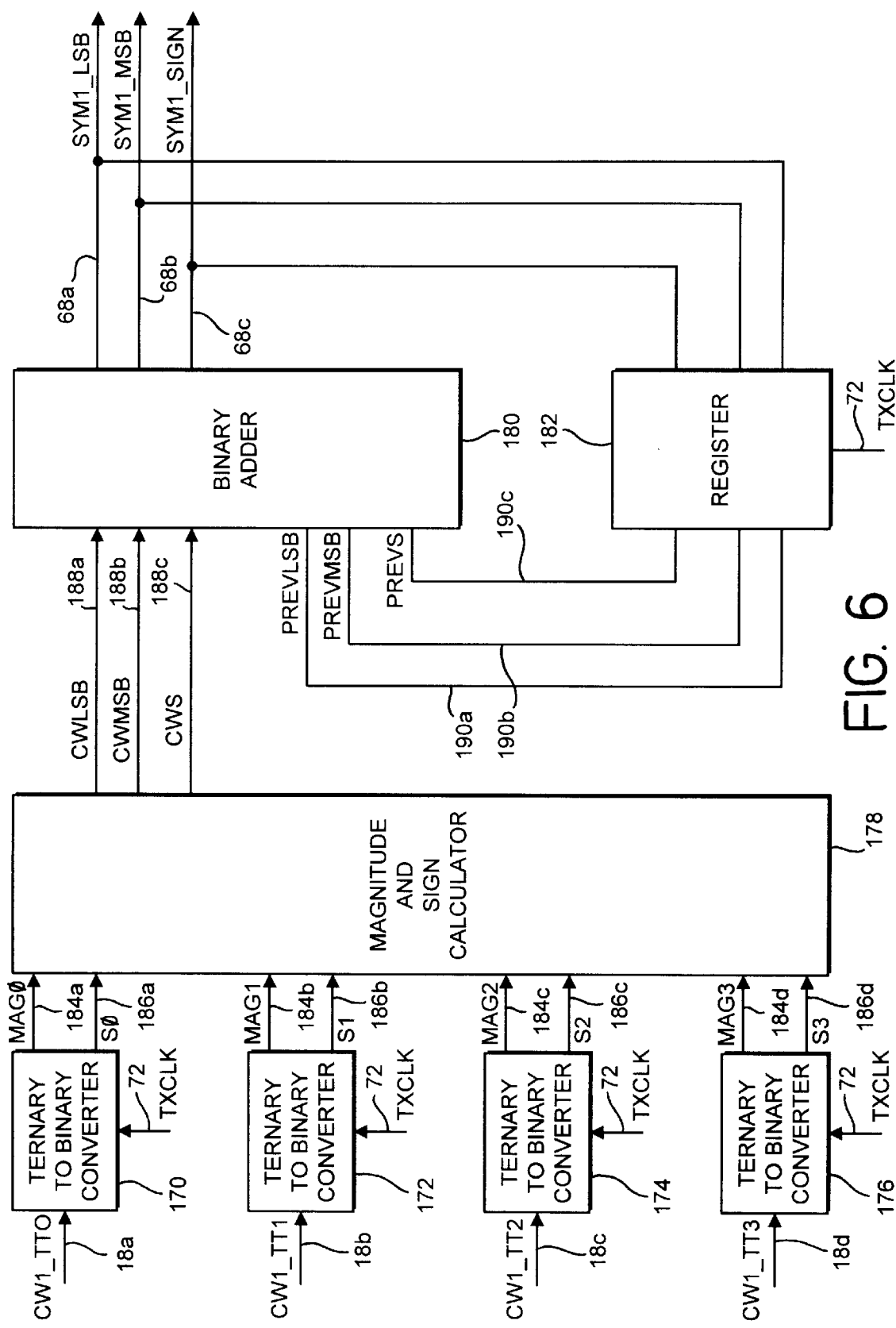
FIG. 6 illustrates circuitry for calculating the running digital sum of code-words according to a preferred embodiment of the present invention.

FIG. 6 illustrates the implementation of the first RDS calculator 58 according to a preferred embodiment of the present invention. The first RDS calculator comprises four ternary to binary converters 170 to 176, a magnitude and sign calculator 178, a binary adder 180, and a three bit register 182. Each of the ternary to binary converters 170 to 176 receives as an input a respective ternary bit CW1_TT0–3 on lines 18a to 18d, generates a respective signal MAG0 to MAG3 representing the magnitude of the input trit on lines 184a to 184d, generates a respective signal S0 to S3 representing the sign of the input trit on lines 186a to 186d, and receives the clock signal TXCLK on line 72. The magnitude and sign calculator 178 receives the signals MAG0–3 and S0–3 as inputs and outputs signals CWLSB, CWMSB and CWS on lines 188a, 188b and 188c respectively. The binary adder 180 receives the signals CWLSB, CWMSB and CWS as inputs, together with signals PREVLSB, PREVMSB and PREVS on lines 190a, 190b and 190c respectively, and generates the signals SYM1_LSB, SYM1_MSB and SYM1_SIGN on lines 68a, 68b and 68c respectively. The three bit register 182 receives the signals SYM1_LSB, SYM1_MSB0 and SYM1_SIGN as its three bit inputs, generates the signals PREVLSB, PREVMSB and PREVS as its respective three bit outputs and is clocked by the clock signal TXCLK.

When a new symbol to be encoded is presented to the encoder 2 under the control of the clock signal TXCLK, the trits of the code-word just transmitted are latched into the ternary to binary converters 170 to 176, and the binary equivalents of these trits are summed in the magnitude and sign calculator 178. The magnitude and sign calculator 178 presents the sum of these bits, which represent the disparity of the code word just transmitted, as the signals CWLSB, CWMSB and CWS. The signal CWLSB represents the least significant bit of the disparity of the code-word just transmitted, the signal CWMSB represents the most significant bit of the disparity of the code-word just transmitted, and the signal CWS represents the sign of the disparity of the code-word just transmitted. Under the control of the clock TXCLK the register 182 also presents at the input of the binary adder 180 the updated signals PREVLSB, PREVMSB and PREVS representing the least significant bit, most significant bit, and sign of the RDS of the code prior to transmission of the code-word latched into the ternary to binary converters 170 to 176 and the disparity of which is currently represented as signals CWLSB, CWMSB and CWS. The binary adder 180 adds the disparity of the code-word just transmitted to the RDS to give an updated RDS represented by the signals SYM1_LSB, SYM1_MSB and SYM1_SIGN. SYM1_LSB represents the least significant bit of the current RDS, SYM1_MSB represents the most significant bit of the current RDS, and SYM1_SIGN represents the sign of the current RDS. The signals SYM1_LSB, SYM1_MSB and SYM1_SIGN will then update the enable and select inputs of the selection circuitry of the first alphabet coder 54, as detailed hereinabove with reference to FIG. 5, on the next edge of the delayed clock signal TXCLKD1.

The second RDS calculator 60 is the same as the first RDS calculator 58, and operates simultaneously thereto on the corresponding bits of the second code-word of the code-word pair.

Figure 7:
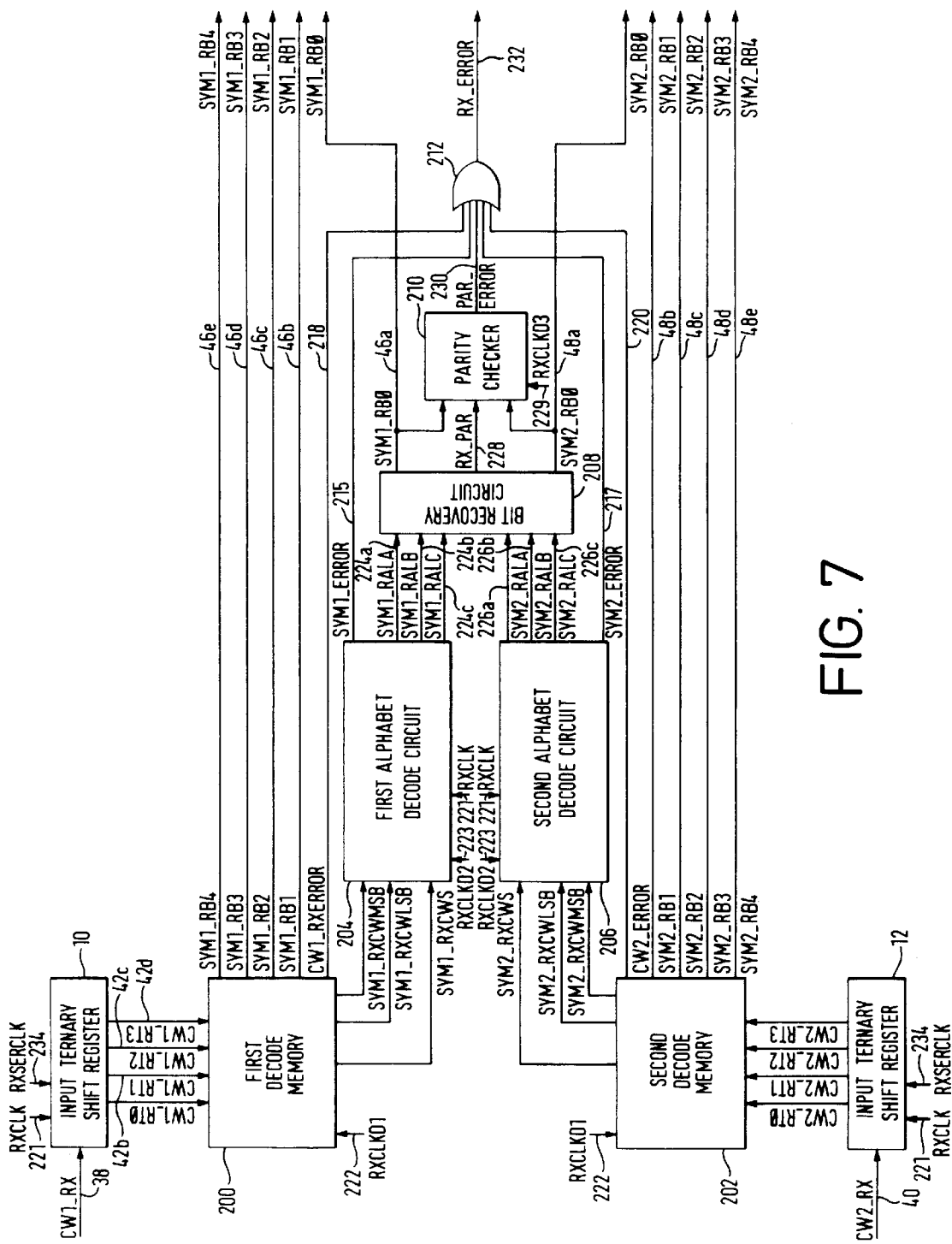
FIG. 7 is a block diagram of a decoder such as may be used in the receiving circuit of FIG. 1.

FIG. 7 illustrates schematically an implementation of the decoder 4 of FIG. 1. FIG. 7 also shows the input ternary shift registers 10 and 12 of FIG. 1. The decoder 4 comprises a first decode memory 200, a second decode memory 202, a first alphabet decode circuit 204, a second decode memory 206, a bit recovery circuit 208, a parity checker 210 and an OR gate 212.

The first decode memory 200 receives the signals CW1_RT0–3 on lines 42 and outputs the signals SYM1_RB1–4 on lines 46, signals SYM1_RXCWMSB, SYM1_RXCWLSB and SYM1_RXCWS on lines 214a, 214b and 214c respectively and a signal CW1_RXERROR on line 218. The second decode memory 202 receives the signals CW2_RT0–3 on lines 44 and outputs signals SYM2_RB1–4 on lines 46, signals SYM2_RXCWMSB, SYM2_RXCWLSB and SYM2_RXCWS on lines 216a, 216b and 216c respectively, and a signal CW2_RXERROR on line 220. The first alphabet decode circuit 204 receives as inputs the signals SYM1_RXCWMSB, SYM1_RXCWLSB and SYM1_RXCWS, and generates outputs SYM1_RALA, SYM1_RALB and SYM1_RALC on lines 224a, 224b and 224c respectively and a signal SYM1_ERROR on line 215. The second pair alphabet decode circuit 206 receives as inputs the signals SYM1_RXCWMSB, SYM1_RXCWLSB and SYM1_RXCWS, and generates outputs SYM2_RALA, SYM2_RALB and SYM2_RALC on lines 226a, 226b and 226c respectively and a signal SYM2_ERROR on line 217. The bit recovery circuit 208 receives as inputs the signals SYM1_RALA, SYM1_RALB, SYM1_RALC, SYM2_RALA, SYM2_RALB and SYM2_RALC and generates as outputs the signals SYM1_RB0 on line 46a and SYM2_RB0 on line 48a, together with a signal RX_PAR on line 228. The parity checker 210 receives as inputs the signals CW1_RB0, CW2_RB0, and RX_PAR and generates a signal PAR_ERROR on line 230. The OR gate 212 has five inputs respectively receiving the signals CW1_ERROR, CW2_ERROR, PAR_ERROR, SYM1_

ERROR, and SYM2_ERROR, and generates an output RX_ERROR on line 232. The first and second decode memories receive a clock signal RXCLKD1 on line 222, the first and second alphabet decode circuits each receive a clock signal RXCLKD2 on line 223 as well as the clock signal RXCLK, and the parity checker receives a clock signal RXCLKD3 on line 229. The input ternary shift registers 10 and 12 receive a clock signal RXSERCLK on line 234 and a clock signal RXCLK on line 221.

In operation, under the control of the clock signal RXSERCLK on line 234 the input ternary shift register 10 serially receives successive first four trit code-words as the signal CW1_RX on line 38, and the input ternary shift register 12 serially receives successive second four trit code-words as the signal CW2_RX on line 40. Simultaneously received first and second code-words form code-word pairs. The serially inputted code-words are outputted from the input ternary shift registers in parallel under the control of the clock signal RXCLK which has a frequency of a quarter of the clock signal RXSERCLK. Thus the serial code-words transmitted on the first twisted pair connection 30 appear in parallel form as the signals CW1_RT0–3 on lines 42a to 42d, and the serial code-words transmitted on the second twisted pair connection 32 appear in parallel form as the signals CW2_RT0–3 on lines 44a to 44d. The code-words are thus presented in parallel form to a respective one of the first decode memory 200 and second decode memory 202.

The first and second decode memories are clocked by the clock signal RXCLKD1 such that the code-words are latched therein. The clock signal RXCLKD1 is the clock signal RXCLK delayed. Thus the parallel outputs of the input ternary shift registers are clocked into the decode memories a short time after being outputted. The first and second decode memories both contain simple look-up tables which are shown in Table IV.

Table IV is the reverse of Table I, and it can be seen that for a latched ternary code-word the tables gives the four bit binary decode plus the code-word disparity. Rather than storing the disparity of each code-word in the look-up table, circuitry could be provided which calculated the code-word disparity of each code-word outputted from the respective look-up table. Such circuitry could be implemented using four ternary to binary converters and a magnitude and sign calculator, as described hereinabove with reference to FIG. 6.

Thus, in response to input signals CW1_RT0–3 a particular row of the decode memory and hence the look-up table of Table IV is selected, and the specific four bit binary symbol is outputted as signals SYM1_RB0–4 and the disparity of the input code-word is outputted as signals SYM1_RXCWMSB, SYM1_RXCWLSB and SYM1_RXCWS signal. SYM1_RXCWMSB is the most significant bit of the first code-word disparity, signal SYM1_RXCWLSB is the least significant bit of the first code-word disparity, and signal SYM1_RXCWS represents the sign of the code-word disparity. The disparity of the first code-word is used to determine the alphabet from which the code-word was encoded, as will be described hereinbelow.

If the disparity of the received code-word is zero, then for the purposes of decoding it is necessary to know whether the received code-word has two zero's or no zero's contained therewithin. In this embodiment of the invention when the code-word disparity is zero the signal SYM1_RXCWS is used to indicate whether the code-word includes two or no zero's.

The operation of the second decode memory is the same as that of the first decode memory, with the appropriate different signals. The disparity of the second code-word is output in binary form on lines 216a to 216c. Signal SYM2_RXCWMSB is the most significant bit of the second code word disparity, signal SYM2_RXCWLSB is the least significant bit of the second code-word disparity, and signal SYM2_RXCWS represents the sign of the second code-word disparity. The disparity of the second code-word is similarly used to determine the alphabet from which the second code-word was encoded.

As the code-words ----, 0000, and ++++ are not used, the look-up tables of the decode memories output respective error signals CW1_ERROR and CW2_ERROR if these code-words are detected.

The bits representing the disparity of the first and second code-words form inputs to respective ones of the first alphabet decode circuit 204 and the second alphabet decode circuit 206. The operation of the first alphabet decode circuit 204 will now be described with reference to FIG. 8.

Figure 8:
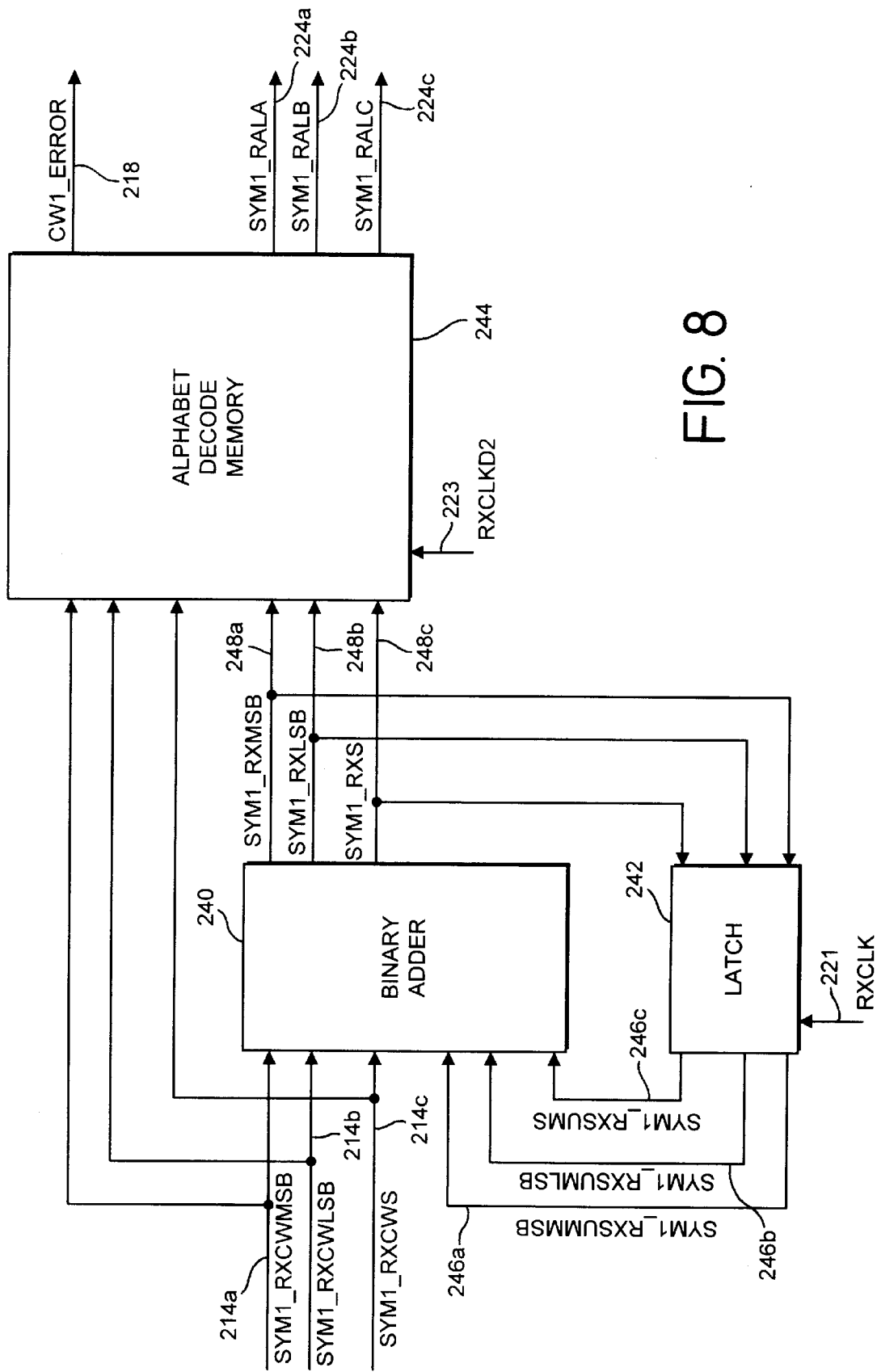
FIG. 8 illustrates an implementation of an alphabet decode circuit according to a preferred embodiment of the present invention.

Referring to FIG. 8, the first alphabet decode circuit comprises a binary adder 240, a three bit latch 242, and an alphabet decode memory 244. The binary adder receives the signals SYM1_RXCWMSB, SYM1_RXCWLSB and SYM1_RXCWS as a first set of inputs, and signals SYM1_RXSUMMSB, SYM1_RXSUMLSB and SYM1_RXSUMS on lines 246a, 246b and 246c respectively. The binary adder outputs signals SYM1_RXMSB, SYM1_RXLSB and SYM1_RXS on lines 248a, 248b and 248c respectively. The latch 242 receives the signals SYM1_RXMSB, SYM1_RXLSB and SYM1_RXS and outputs the signals SYM1_RXSUMMSB, SYM1_RXSUMLSB and SYM1_RXSUMS under the control of the clock signal RXCLK. The alphabet decode memory receives as a first set of inputs the signals SYM1_RXCWMSB, SYM1_RXCWLSB and SYM1_RXCWS and as a second set of inputs the signals SYM1_RXMSB, SYM1_RXLSB and SYM1_RXS, and outputs the signals SYM1_RALA, SYM1_RALB and SYM1_RALC on lines 224a, 224b and 224c, and the signal SYM1_ERROR under the control of a clock signal RXCLKD2.

The signals SYM1_RXSUMMSB, SYM1_RXSUMLSB and SYM1_RXSUMS on the output of the latch 242 represent the RDS of the code up to the previous code-word received, i.e. the code-word received immediately before the code-word the disparity of which is currently represented as signals SYM1_RXCWMSB, SYM1_RXCWLSB and SYM1 _RXCWS. The signal SYM1_RXSUMMSB represents the most significant bit of the RDS, the signal SYM1_RXSUMLSB represents the least significant bit of the RDS, and the signal SYM1_RXSUMS represents the sign of the RDS. The binary adder adds the current code-word disparity to the previous RDS to generate a new RDS, which includes the disparity of the currently received code-word, as signals SYM1_RXMSB, SYM1_RXLSB and SYM1_RXS. The signal SYM1_RXMSB represents the most significant bit of the new RDS, the signal SYM1_RXLSB represents the least significant bit of the new RDS, and the signal SYM1_RXS represents the sign of the new RDS.

Hence, the two sets of inputs to the alphabet decode memory 244 represent the disparity of the received code-word and new RDS of the code after the new code-word has been received. These two values are latched into the alphabet decode memory under the control of the clock signal RXCLKD2. The alphabet decode memory stores a look-up table the contents of which are shown in Table V.

Referring to Table V the received code-word disparity will form the row address of the alphabet decode memory and the new RDS of the code will form the column address of the alphabet decode memory. Thus, one of the outputs of the alphabet decode memory is set high in dependence on the magnitude and sign of the disparity of the received code-word and new RDS such that the alphabet from which the code-word was encoded is determined. As explained hereinabove, when the magnitude of the code-word disparity is zero the sign of the disparity indicates whether the code-word has two zero's or no zero's. Hence one of the signals SYM1_RALA, SYM1_RALB or SYM1_RALC is set. It should also be noted that there are certain combinations of received code-word disparity and new RDS which would indicate an error has occurred, and in such circumstances the error signal SYM1_ERROR is set.

The alphabet decode memory 244 is clocked by the clock signal RXCLKD2, which is the delayed clock signal RXCLKD1, so that the inputs to the alphabet decode memory have time to settle after the output of the latch binary adder is updated in response to the updated outputs of the first decode memory 200.

The second alphabet decode circuit 206 simultaneously operates in exactly the same manner as the first pair alphabet decode circuit to determine from which alphabet the second code-word was encoded and thus set one of the signals SYM2_RALA, SYM2_RALB, SYM2_RALC or SYM2_ERROR.

The determination of the respective alphabet from which each code-word was encoded is next used by the bit recovery circuit 208 to determine the fifth bit of each symbol of the pair. The bit recovery circuit comprises combinational logic which sets the outputs SYM1_RB0, SYM2_RB0 and RX_PAR in dependence on the current state of the signals SYM1_RALA, SYM1_RALB, SYM1_RALC, SYM2_RALA, SYM2_RALB and SYM2_RALC. The logic sets the outputs according to Table VI. Table VI is the reverse of Table III.

The generation of the fifth bits SYM1_RB0 and SYM2_RB0 for each symbol completes the decode, and thus the two symbols of a symbol pair are presented in parallel as respective sets 46 and 48 to be routed through the computer.

The preferred embodiment also provides error detection circuitry in the form of the parity checker 210 which allows a single bit error to be immediately detected. The operation of the parity checker 210 will now be described with reference to FIG. 9.

Figure 9:
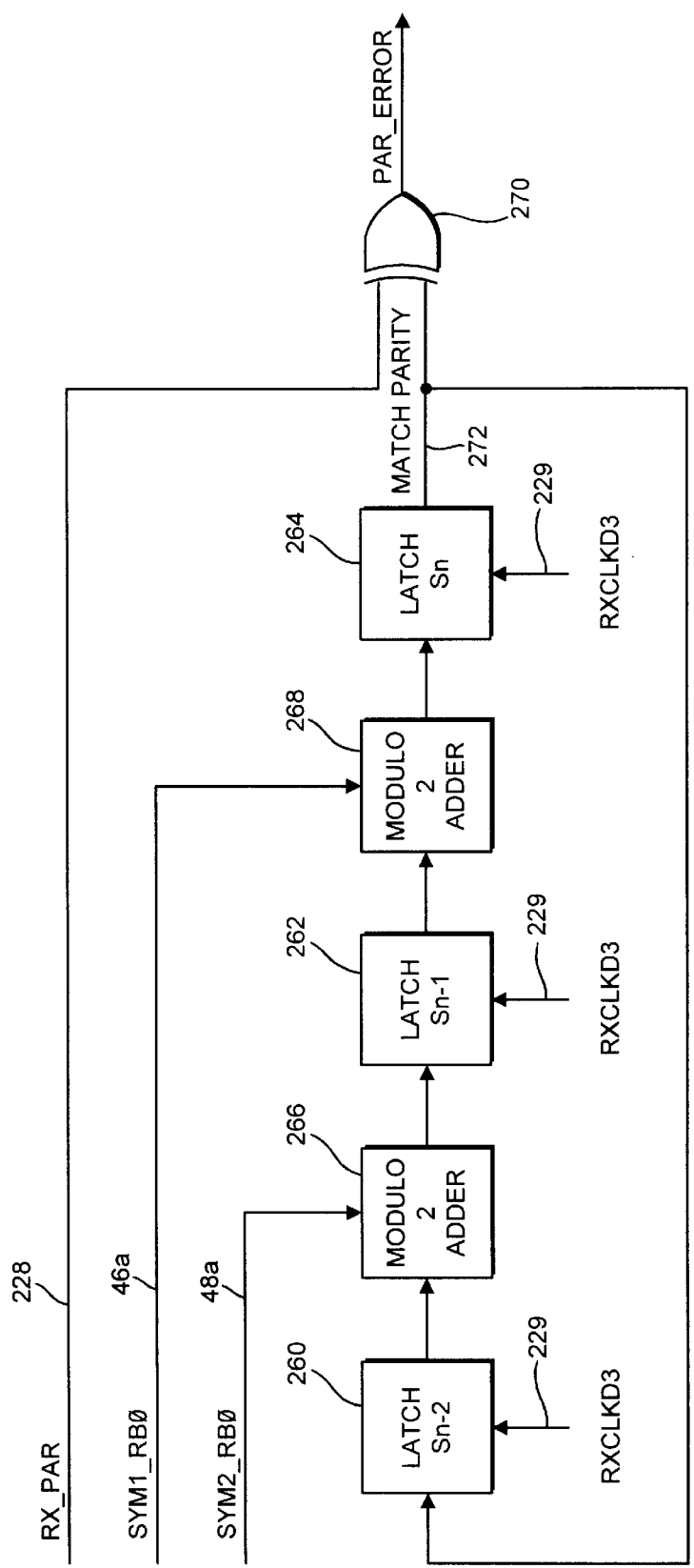
FIG. 9 illustrates an implementation of a parity checker according to a preferred embodiment of the present invention.

Referring to FIG. 9, the parity checker 210 comprises a latch Sn-2 260, a latch Sn-1 262 and a latch Sn 264, two modulo-2 adders 266 and 268, and an exclusive-OR gate 270. The latches are all clocked by the clock signal RXCLKD3 which is delayed relative to the clock signal RXCLKD2 so that the outputs of the bit recovery circuit 208 have time to settle in response to the updated output of the first and second alphabet decode circuits before being latched into the parity checker.

The modulo-2 adders 266 and 268 each have two inputs and an output. Modulo-2 adder 266 receives as one input the output of latch Sn-2 260 and as the other input the bit SYM2_RB0 on line 48a. The output of modulo-2 adder 266, which is the modulo-2 sum of its inputs, forms the input to latch Sn-1 262. Modulo-2 adder 268 receives as one input the bit SYM1_RB0 on line 46a, and as the other input the output of the latch Sn-1 262. The output of modulo-2 adder 268, which is the modulo-2 sum of its inputs, forms the input to latch Sn 264. The output of latch Sn 264 forms a signal MATCHPARITY on line 272 and the input to the Sn-2 latch 260. The exclusive-OR gate receives two inputs: the signal RX_PAR on line 228 and the signal MATCHPARITY on line 272, and generates a signal PAR_ERROR on output line 271.

With the exception of exclusive-OR gate 270, the parity checker 210 is identical to the parity generator 50 of the encoder. The signal MATCHPARITY is generated in the parity checker using the corresponding recovered bits of the pair of symbols as were used to generate the signal TX_PAR in the parity generator 50. Thus if the signal MATCHPARITY is not identical to the recovered parity bit RX_PAR an error must have occurred and hence the signal PAR_ERROR is set.

All the error signals PAR_ERROR, CW1_ERROR, SYM1_ERROR, CW2_ERROR, SYM2_ERROR are input to the OR gate 212 of the decoder 4, the output of which forms the error signal RX_ERROR which is used to flag an error to the circuitry controlling the decoder 4.

The source of the clock signals RXCLK, RXCLKD1, RXCLKD2, RXCLKD3 and RXSERCLK is beyond the scope of the invention. Each of the clock signals RXCLKD1, RXCLKD2, RXCLKD3 and RXSERCLK, may be derived from the clock RXCLK. The clock RXCLK may be derived from and sychronised to the clock signal TXCLK. Alternatively, the clock signal RXCLK may be recovered from the incoming code-words at the decoder using a technique such as over-sampling.

In the preferred embodiment hereinabove it has been described that the alphabet group for selecting code words to encode symbols can be selected using various parameters, including the running digital sum of the code. Using the running digital sum to select the groups enables the running digital sum of the code word to be maintained within finite bounds. However, it would be possible to select the alphabet groups using other different known techniques. One such technique involves scrambling the encoded data and using the scrambled data to randomly select the alphabet groups for selecting code words. Such a technique achieves a code which is statistically dc balanced due to the high probability of the code remaining within finite bounds.

TABLE I

TERNARY CODE WORDS

| Binary Symbols | Extreme RDS Alphabets RDS = ±2 | | | | | Non-extreme RDS Alphabets +2 > RDS > −2 | | |
|---|---|---|---|---|---|---|---|---|
| | A | | B | | C | A | B | C |
| | +1 | −1 | +2 | −2 | +3 −3 | +1 | −1 | 0 |
| 0000 | +−+0 | −+−0 | +−++ | +−−− | −0+0 | +−+0 | −+−0 | −0+0 |
| 0001 | 000+ | 000− | +++− | −−−+ | 00−+ | 000+ | 000− | 00−+ |
| 0010 | 00+0 | 00−0 | −+++ | +−−− | 00+− | 00+0 | 00−0 | 00+− |
| 0011 | 0−++ | 0+−− | 00++ | 00−− | 0+−0 | 0−++ | 0+−− | 0+−0 |
| 0100 | 0+00 | 0−00 | ++−− | | 0−+0 | 0+00 | 0−00 | 0−+0 |
| 0101 | −+0+ | +−0− | 0+0+ | 0−0− | 0+0− | −+0+ | +−0− | 0+0− |
| 0110 | −++0 | +−−0 | 0++0 | 0−−0 | 0−0+ | −++0 | +−−0 | 0−0+ |
| 0111 | −0++ | +0−− | +−+− | | 0+++ 0−−− | −0++ | +0−− | +−+− |
| 1000 | +000 | −000 | −−++ | | +−00 | +000 | −000 | +−00 |
| 1001 | +0−+ | −0+− | +00+ | −00− | −+00 | +0−+ | −0+− | −+00 |
| 1010 | +0+− | −0−+ | +0+0 | −0−0 | +0−0 | +0+− | −0−+ | +0−0 |
| 1011 | +−0+ | −+0− | +−−+ | | +0++ −0−− | +−0+ | −+0− | +−−+ |
| 1100 | ++0− | −−0+ | ++00 | −−00 | +00− | ++0− | −−0+ | +00− |
| 1101 | 0+−+ | 0−+− | −++− | | ++0+ −−0− | 0+−+ | 0−+− | −++− |
| 1110 | 0++− | 0−−+ | −+−+ | | +++0 −−−0 | 0++− | 0−−+ | −+−+ |
| 1111 | ++−0 | −−+0 | ++−+ | −−+− | −00+ | ++−0 | −−+0 | −00+ |

TABLE II

| Current State | NEXT STATE |||||||| 
|---|---|---|---|---|---|---|---|---|
| | SYM2-TBφ 1 | SYM1-TBφ 1 | SYM2-TBφ 1 | SYM1-TBφ 0 | SYM2-TBφ 0 | SYM1-TBφ 1 | SYM2-TBφ 0 | SYM1-TBφ 0 |
| 0 | 3 | | 2 | | 1 | | 0 | |
| 1 | 7 | | 6 | | 5 | | 4 | |
| 2 | 2 | | 3 | | 0 | | 1 | |
| 3 | 6 | | 7 | | 4 | | 5 | |
| 4 | 1 | | 0 | | 3 | | 2 | |
| 5 | 5 | | 4 | | 7 | | 6 | |
| 6 | 0 | | 1 | | 2 | | 3 | |
| 7 | 4 | | 5 | | 6 | | 7 | |

TABLE III

| | | TX-PAR |||| 
|---|---|---|---|---|---|
| | | 0 || 1 ||
| SYM2-TBφ | SYM1-TBφ | CODE WORD 1 | CODE WORD 2 | CODE WORD 1 | CODE WORD 2 |
| 0 | 0 | B | C | C | A |
| 0 | 1 | B | B | A | B |
| 1 | 0 | A | A | B | A |
| 1 | 1 | C | B | A | C |

TABLE IV

| Received code-word | Binary value | Hex value | Disparity |
|---|---|---|---|
| 0000 | Err | | (0) |
| 000- | x0001 | 1 | -1 |
| 000+ | x0001 | 1 | +1 |
| 00-0 | x0010 | 2 | -1 |
| 00-- | x0011 | 3 | -2 |
| 00-+ | x0001 | 1 | 0 (two zeros) |
| 00+0 | x0010 | 2 | +1 |
| 00+- | x0010 | 2 | 0 (two zeros) |
| 00++ | x0011 | 3 | +2 |
| 0-00 | x0100 | 4 | -1 |
| 0-0- | x0101 | 5 | -2 |
| 0-0+ | x0110 | 6 | 0 (two zeros) |
| 0--0 | x0110 | 6 | -2 |
| 0--- | x0111 | 7 | -3 |
| 0--+ | x1110 | E | -1 |
| 0-+0 | x0100 | 4 | 0 (two zeros) |
| 0-+- | x1101 | D | -1 |
| 0-++ | x0011 | 3 | +1 |
| 0+00 | x0100 | 4 | +1 |
| 0+0- | x0101 | 5 | 0 (two zeros) |
| 0+0+ | x0101 | 5 | +2 |
| 0+-0 | x0011 | 3 | 0 (two zeros) |
| 0+-- | x0011 | 3 | -1 |
| 0+-+ | x1101 | D | +1 |
| 0++0 | x0110 | 6 | +2 |
| 0++- | x1110 | E | +1 |
| 0+++ | x0111 | 7 | +3 |
| -000 | x1000 | 8 | -1 |
| -00- | x1001 | 9 | -2 |
| -00+ | x1111 | F | 0 (two zeros) |
| -0-0 | x1010 | A | -2 |
| -0-- | x1011 | B | -3 |
| -0-+ | x1010 | A | -1 |
| -0+0 | x0000 | 0 | 0 (two zeros) |
| -0+- | x1001 | 9 | -1 |
| -0++ | x0111 | 7 | +1 |
| --00 | x1100 | C | -2 |
| --0- | x1101 | D | -3 |
| --0+ | x1100 | C | -1 |
| ---0 | x1110 | E | -3 |

TABLE IV-continued

| Received code-word | Binary value | Hex value | Disparity |
|---|---|---|---|
| ---- | Err | | (-4) |
| ---+ | x0001 | 1 | -2 |
| --+0 | x1111 | F | -1 |
| --+- | x1111 | F | -2 |
| --++ | x1000 | 8 | 0 (no zero) |
| -+00 | x1001 | 9 | 0 (two zeros) |
| -+0- | x1011 | B | -1 |
| -+0+ | x0101 | 5 | +1 |
| -+-0 | x0000 | 0 | -1 |
| -+-- | x0000 | 0 | -2 |
| -+-+ | x1110 | E | 0 (no zero) |
| -++0 | x0110 | 6 | +1 |
| -++- | x1101 | D | 0 (no zero) |
| -+++ | x0010 | 2 | +2 |
| +000 | x1000 | 8 | +1 |
| +00- | x1100 | C | 0 (two zeros) |
| +00+ | x1001 | 9 | +2 |
| +0-0 | x1010 | A | 0 (two zeros) |
| +0-- | x0111 | 7 | -1 |
| +0-+ | x1001 | 9 | +1 |
| +0+0 | x1010 | A | +2 |
| +0+- | x1010 | A | +1 |
| +0++ | x1011 | B | +3 |
| +-00 | x1000 | 8 | 0 (two zeros) |
| +-0- | x0101 | 5 | -1 |
| +-0+ | x1011 | B | +1 |
| +--0 | x0110 | 6 | -1 |
| +--- | x0010 | 2 | -2 |
| +--+ | x1011 | B | 0 (no zero) |
| +-+0 | x0000 | 0 | +1 |
| +-+- | x0111 | 7 | 0 (no zero) |
| +-++ | x0000 | 0 | +2 |
| ++00 | x1100 | C | +2 |
| ++0- | x1100 | C | +1 |
| ++0+ | x1101 | D | +3 |
| ++-0 | x1111 | F | +1 |
| ++-- | x0100 | 4 | 0 (no zero) |
| ++-+ | x1111 | F | +2 |
| +++0 | x1110 | E | +3 |
| +++- | x0001 | 1 | +2 |
| ++++ | Err | | (+4) |

TABLE V

| Received code-word disparity | RDS = +2 | RDS = -2 | RDS = +1 | RDS = -1 | RDS = 0 |
|---|---|---|---|---|---|
| +3 | Err | C | Err | Err | Err |
| +2 | Err | B | Err | Err | Err |
| +1 | Err | A | A | A | A |
| 0 (with two zeros) | C | C | C | C | C |

TABLE V-continued

|  | RDS = +2 | RDS = −2 | RDS = +1 | RDS = −1 | RDS = 0 |
|---|---|---|---|---|---|
| 0 (with no zeros) | B | B | C | C | C |
| −1 | A | Err | B | B | B |
| −2 | B | Err | Err | Err | Err |
| −3 | C | Err | Err | Err | Err |

TABLE VI

| ALPHABET | | | | |
|---|---|---|---|---|
| CODE WORD 1 | CODE WORD 2 | SYM2-RBφ | SYM1-RBφ | RX-PAR |
| A | A | 1 | 0 | 0 |
| A | B | 0 | 1 | 1 |
| A | C | 1 | 1 | 1 |
| B | A | 1 | 0 | 1 |
| B | B | 0 | 1 | 0 |
| B | C | 0 | 0 | 0 |
| C | A | 0 | 0 | 1 |
| C | B | 1 | 1 | 0 |

What is claimed is:

1. A method of encoding a five bit symbol into a four trit code word, comprising the steps of:

defining out of forty-eight combinations of four trit code words three groups, each group containing sixteen code words, each code word within a group having a Hamming distance of at least two from any other code word in that group and each code word being associated with a particular combination of four bits selected from said five bit symbol;

selecting one of said groups; and selecting a code word from said group in accordance with four bits out of said five bit symbol.

2. The method according to claim 1 wherein the group is selected using the running digital sum of successive encoded symbols.

3. The method according to claim 1 further comprising the step of generating an additional bit in dependence on the other bit of said five bit symbol, and using said additional bit and said other bit with said running digital sum to select said group.

4. The method of claim 3 wherein said additional bit is a parity bit.

5. The method of claim 4 wherein said step of generating the additional bit uses a convolution function.

6. The method according to claim 1 wherein said groups comprise a first group containing code words having a disparity of plus one, a second group containing code words having a disparity of minus one and a third group containing code words having a disparity of zero, for use when the running digital sum is less than plus two and greater than minus two.

7. The method according to claim 6 wherein there are three further groups each consisting of code word pairs for use when the running digital sum is equal to ±2, wherein each group contains for each symbol a pair of code words having a matched or opposite disparity, wherein the first group includes code words having a disparity of plus or minus one, the second group includes code words having a disparity of plus or minus two and the third group includes code words having a disparity of plus or minus three.

8. The method according to claim 7 wherein the second group and the third group further include code-words having zero disparity, the code-words having zero disparity being paired with each other.

9. The method according to claim 8 wherein the second group contains code words having zero disparity but no zeros and the third group contains code words having zero disparity and two zeros.

10. Data transmission circuitry comprising:

input circuitry for receiving a sequence of symbols having five binary bits;

encoding circuitry for encoding each five bit symbol into a code word having four ternary trits; and output circuitry for transmitting a sequence of four trit code words, wherein the encoding circuitry includes a group select circuit which selects one of three groups each containing sixteen code words defined out of forty-eight combinations of four trit code words, each code word within a group having a Hamming distance of at least two from any other code word in that group, each code word being associated with a particular combination of four bits selected from said five bit symbol, the encoding circuit being operable to generate said code word in dependence on four bits of said five bit symbol in accordance with the group selected for that symbol.

11. Data transmission circuitry according to claim 10 further comprising running digital sum calculation circuitry for calculating the running digital sum of successive code words wherein the group select circuit uses the running digital sum of successive code words to select one of the three groups.

12. Data transmission circuitry according to claim 10 wherein the group selector includes bit generating circuitry for generating an additional bit in dependence on the other bit of the five bit symbol, said additional bit being used with said other bit to select said groups.

13. Data transmission circuitry according to claim 11 wherein the bit generating circuitry is parity bit generating circuitry.

14. Data transmission circuitry according to claim 10 wherein said groups comprise a first group containing code words having a disparity of plus one, a second group containing code words having a disparity of minus one and a third group containing code words having a disparity of zero, for use when the running digital sum is less than plus two and greater than minus two.

15. A method of decoding a sequence of code words each having four ternary trits into a sequence of symbols each having five binary bits comprising the steps of:

generating four binary bits in dependence on the four ternary trits of each code word;

determining the disparity of the code word;

calculating the running digital sum of successive code words;

using the running digital sum and the disparity to determine one of three groups of code words from which said code word has been encoded, each of said groups having sixteen code words selected from forty-eight combinations of four trit code words, each code word within a group having a Hamming distance of at least two from any other code word in that group, each code word being associated with a particular combination of four bits; and generating the fifth bit for each set of four binary bits in accordance with said determined group to define said symbols.

16. The method of claim 15 further comprising the step of:

generating a first parity bit in accordance with said determined group;

generating a second parity bit in dependence on said fifth binary bit; and comparing said first and second parity bits, wherein a difference in said bits indicates an error.

17. The method of claim 16 wherein said step of generating a second parity bit uses a convolution function.

18. The method of claim 15 wherein said groups comprise a first group containing code words having a disparity of plus one, a second group containing code words having a disparity of minus one and a third group containing code words having a disparity of zero, for use when the running digital sum is less than plus two and greater than minus two.

19. The method according to claim 18 wherein there are three further groups each consisting of code word pairs for use when the running digital sum is equal to ±2, wherein each group contains for each symbol a pair of code words having a matched or opposite disparity, wherein the first group includes code words having a disparity of plus or minus one, the second group includes code words having a disparity of plus-or minus two and the third group includes code words having a disparity of plus or minus three.

20. The method according to claim 19 wherein the second group and the third group further include code-words having zero disparity, the code-words having zero disparity being paired with each other.

21. The method according to claim 20 wherein the second group contains code words having zero disparity but no zeros and the third group contains code words having zero disparity and two zeros.

22. Data receiving circuitry comprising:

input circuitry for receiving a sequence of code words each having four trits;

translation circuitry for translating the code words into a sequence of symbols each having four binary bits;

circuitry for determining the disparity of each code word;

circuitry for calculating the running digital sum of successive code words;

bit generating circuitry for generating a fifth binary bit in accordance with a respective group determined in dependence on the running digital sum and the disparity, said group being one of three groups of code words from which said symbol has been encoded each group having sixteen code words defined out of forty-eight combinations of four trit code words, each code word within a group having a Hamming distance of at least two from any other code word in that group, each code word being associated with a particular combination of four bits; and output circuitry for generating symbols each comprising said set of four binary bits and the fifth bit generated by the bit generation circuitry.

23. Data receiving circuitry according to claim 22 which includes error checking circuitry comprising:

a first parity bit generator for generating a first parity bit in accordance with said determined group;

a second parity bit generator for generating a second parity bit in dependence on said fifth binary bit; and compare circuitry for comparing said first and second parity bits, wherein a difference in said bit indicates an error.

24. Data receiving circuitry according to claim 22 wherein said groups comprise a first group containing code words having a disparity of plus one, a second group containing code words having a disparity of minus one and a third group containing code words having a disparity of zero, for use when the running digital sum is less than plus two and greater than minus two.

* * * * *